United States Patent [19]
Findley et al.

[11] Patent Number: 5,763,955
[45] Date of Patent: Jun. 9, 1998

[54] PATTERNED FILLED LAYERS FOR INTEGRATED CIRCUIT MANUFACTURING

[75] Inventors: Paul Raj Findley, Cupertino; Morgan Smith, San Francisco, both of Calif.

[73] Assignee: VLSI Technology, Inc., San Jose, Calif.

[21] Appl. No.: 673,950

[22] Filed: Jul. 1, 1996

[51] Int. Cl.[6] .................................................. G03F 7/26
[52] U.S. Cl. ........................... 257/775; 257/773; 364/490; 364/491; 430/311; 430/313; 430/318; 430/312
[58] Field of Search ................................. 364/491, 490; 257/762, 763, 773, 775; 430/312, 311, 313, 318; 437/43

[56] References Cited

U.S. PATENT DOCUMENTS

| | | | |
|---|---|---|---|
| 5,153,143 | 10/1992 | Schlais et al. | 437/43 |
| 5,210,701 | 5/1993 | Hana et al. | 364/491 |
| 5,351,197 | 9/1994 | Upton et al. | 364/491 |
| 5,654,589 | 8/1997 | Huang et al. | 257/763 |
| 5,667,940 | 9/1997 | Hsue et al. | 430/312 |

OTHER PUBLICATIONS

S. Wolf, *Silicon Processing for the VLSI Era, vol. 2—Process Integration*, Lattice Press 1990, pp. 229–236.

D. Webb, S. Sivaram, D. Stark, H. Bath, J. Draina, R. Leggett, and R. Tolles, *Complete Intermetal Planarization Using ECR Oxide and Chemical Mechanical Polish*, 1992 ISMIC, pp. 141–148.

M. Ichikawa, et al, *Multilevel Interconnect System for 0.35 μm CMOS LSI's with metal dummy planarization process and thin tungsten Wirings*, 1995 VMIC Conference, 1995 ISMIC, pp. 254–269.

*Primary Examiner*—Viet Q. Nguyen
*Attorney, Agent, or Firm*—Douglas L. Weller

[57] ABSTRACT

A metal layer on an integrated circuit includes active signal lines and fill metal segments. The fill metal segments are polygons. Each fill metal segment at its narrowest has a width which is not greater than 1.25 times a design rule metal pitch for a technology used to fabricate the integrated circuit. In addition, each fill metal segment is separated from every other fill metal segment by spacing which is at least 0.7 times the design rule metal pitch for the technology used to fabricate the integrated circuit. Also, each fill metal segment is separated from every active signal line by spacing which is at least 0.5 times the design rule metal pitch for the technology used to fabricate the integrated circuit.

12 Claims, 9 Drawing Sheets

PATTERNED FILLED LAYERS FOR INTEGRATED CIRCUIT MANUFACTURING

BACKGROUND

The present invention concerns the field of integrated circuit manufacturing and pertains particularly to constraints for layers with patterned fill.

When processing integrated circuits, masks are utilized to pattern and etch layers of material deposited on a wafer. These layers are composed of, for example, polysilicon, metal or oxide.

The trend in integrated circuit manufacturing is to increase the amount of circuitry within each individual integrated circuit. Along with this trend there is an increase in the number of layers used and a decrease in the dimensions of the patterned material.

The planarity of topology underlying a deposited layer of material can have a significant impact on the ability to pattern and etch the deposited layer. As the numbers of layers increase and the dimensions of the patterns decrease, the planarity of topology underlying some layers, particularly the interconnect layers such as polysilicon layers and metal layers, can be significantly affected. Each additional interconnect layer increases the variation in step heights for the interconnect layers above. However, when patterning and etching these top interconnect layers, the depth of focus for high resolution photolithographic step and exposure systems used to pattern these top layers limits the amount of planar variation in the underlying topology that can be tolerated.

Various methods have been used to increase planarization in topology. For example, a spin-on glass (SOG)/etchback process can be used. In the SOG/etchback process, after patterning and etching certain layers, in on glass flows over the wafer filling narrow gaps. SOG/etchback is a cost effective method to improve local planarization of the layer. See, for example, S. Wolf, *Silicon Processing for the VLSI Era, Vol. 2—Process Integration*, Lattice Press 1990, pp. 229–236. While effective for filling narrow gaps, this SOG/etchback process is ineffective in reducing height differences between dense regions having a lot of circuitry and open regions including little or no circuitry.

Another method used to increase planarity is a chemical mechanical polishing process used after deposition of dielectric layers. See for example, D. Webb, S. Sivaram, D. Stark, H. Bath, J. Draina, R. Leggett, and R. Tolles, *Complete Intermetal Planarization Using ECR Oxide and Chemical Mechanical Polish*, 1992 ISMIC, pp. 141–148. However, this method has not proved cost-effective.

More recently, dummy patterns are placed between wirings so that the metal space remains less than a certain length. See, for example, M. Ichikawa, K. Inoue, K. Izumi, S. Sato, S. Mitarai, M. Kay, K. Watanabe, *Multilevel Interconnect System for 0.35 μm CMOS LSI's with metal dummy planarization process and thin tungsten Wirings*, 1995 VMIC Conference, 1995 ISMIC—104/95/0254, pp. 254–269.

SUMMARY OF THE INVENTION

In accordance with the preferred embodiment of the present invention, a metal layer on an integrated circuit includes active signal lines and fill metal segments. The fill metal segments are polygons. In a preferred embodiment of the present invention, each fill metal segment has a width at its narrowest point which is not greater than 1.25 times a design rule metal pitch for a technology used to fabricate the integrated circuit. In addition, each fill metal segment is separated from every other fill metal segment by spacing which is at least 0.7 times the design rule metal pitch for the technology used to fabricate the integrated circuit. Also in the preferred embodiment, each fill metal segment is separated from every active signal line by spacing which is at least 0.5 times the design rule metal pitch for the technology used to fabricate the integrated circuit. For example, the fill metal segments are rectangles arranged in a herring bone formation.

The present invention allows for global planarization of processing layers in an integrated circuit manufacturing process while minimizing detrimental performance degradation which can result from additional capacitance introduced by fill metal segments.

DESCRIPTION OF THE PREFERRED EMBODIMENT

In the present invention, metal fill is used to assist in achieving process uniformity in semiconductor process steps. Uniformity is achieved in metal patterning and especially planarization. The metal fill is composed of electrically floating pieces of metal placed in a metal circuit layer. The metal fill is also referred to as dummy metal or dummy metal fill.

Selection of a pattern for metal fill is done to achieve a desired degree of global planarization, and to aid other processing steps. Additionally, in the present invention, spacing within a metal fill pattern and between the metal fill and active metal is controlled by constraints which balance considerations of the necessity of planarization with the minimization of capacitance introduced by the metal fill pattern.

For example, where the effects of capacitance are not taken into account, an otherwise isolated active signal line can gain almost 40% in AC capacitance to ground. This is due, for example, to the coupling of the signal line to the metal fill, the coupling of segments within the metal fill among themselves, and the coupling of the metal fill to the ground plane. When an active signal line is long and therefore responsible for significant signal delay in the circuit, there is expected a similar almost 40% increase in the propagation time of a signal. This represents a severe degradation of circuit performance.

In the present invention, certain constraints in spacing of metal fill segments are used to significantly reduce the effects of capacitance while still allowing for satisfactory planarization. The constraints are based on the design rule metal pitch (Dp) for a given technology. Design rule metal pitch is the repetition distance or period of a layout of metal lines and spaces drawn to their minimum respective dimensions for a given technology generation. It is the sum of the minimum width of a metal segment plus the minimum spacing allowed between metal segments.

The metal fill is composed of rectangular fill segments, also called fill bar segments. Alternatively, the fill segments may be another form of polygon. In the preferred embodiment of the present invention, the width (X) of each fill bar segment (in the short direction) is less than or equal to a first constant times the design rule metal pitch. For example, the width (X) of each fill bar segment (in the short direction) is less than or equal to 1.25 times the design rule metal pitch. This is represented by the following formula:

$$X<=1.25*Dp$$

Also, in the preferred embodiment of the present invention, the space (Y) between any pair of fill bar segment is greater than or equal to a second constant times the design rule metal pitch. For example, the space (Y) between any pair of fill bar segments is greater than or equal to 0.7 times the design rule metal pitch. This is represented by the following formula:

$$Y>=0.7*Dp$$

Also, in the preferred embodiment of the present invention, the space (Z) between any fill bar segment and an active signal line is greater than or equal to a third constant times the design rule metal pitch. For example, the space (Z) between any fill bar segment and an active signal line is greater than or equal to 0.5 times the design rule metal pitch. This is represented by the following formula:

$$Z>=0.5*Dp$$

Use of the above set of design constraints is expected to limit the increase in capacitance from the addition of metal fill to a circuit to be less than 25%. In one case studied, where the constraints were satisfied by a comfortable margin, the capacitance increase was limited to 11%. This is a significant improvement over prior art designs.

Figure 1:
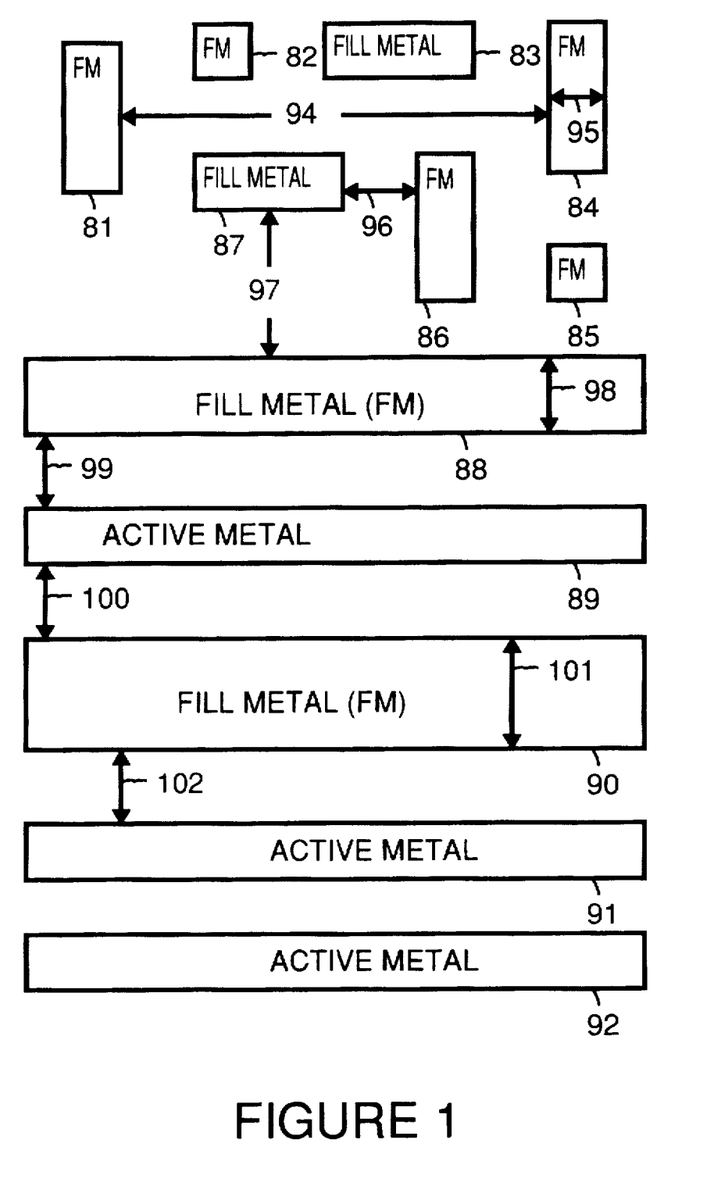
FIG. 1 illustrates critical dimensions of a pattern fill in accordance with a preferred embodiment of the present invention.

FIG. 1 illustrates the design constraints set out above. FIG. 1 shows an area of a circuit through which passes an active metal line 89, an active metal line 91 and an active metal line 92. In addition to the active metal lines, there has been added a fill metal segment 81, a fill metal segment 82, a fill metal segment 83, a fill metal segment 84, a fill metal segment 85, a fill metal segment 86, a fill metal segment 87, a fill metal segment 88 and a fill metal segment 90.

The width (X) of a fill bar segment (i.e., in the short direction) is variously illustrated by an arrow 95, an arrow 98 and an arrow 101. In the preferred embodiment of the present invention, the width (X) of each fill bar segment (in the short direction) is less than or equal to 1.25 times the design rule metal pitch.

The space (Y) between each fill bar segment is variously illustrated by an arrow 94, an arrow 96 and an arrow 97. In the preferred embodiment of the present invention, the space (Y) between each fill bar segment is greater than or equal to 0.7 times the design rule metal pitch.

The space (Z) between any fill bar segment and an active signal line is variously illustrated by an arrow 99, an arrow 100 and an arrow 102. In the preferred embodiment of the present invention, the space (Z) between any fill bar segment and an active signal line is greater than or equal to 0.5 times the design rule metal pitch.

For example, in the CMN5 technology of VLSI Technology Inc., which has a business address of 1109 McKay Drive, San Jose Calif., the design rule metal pitch is 2.4 micrometers. Thus, when the width (X) of each fill bar segment is less than or equal to 1.25 times the design rule metal pitch, the width (X) of each fill bar segment is less than or equal 1.25*2.4 µm, which is 3 µm. When the space (Y) between each fill bar segment is greater than or equal to 0.7 times the design rule metal pitch, the space (Y) between each fill bar segment is greater than or equal to 0.7*2.4 µm, which is 1.68 µm. When the space (Z) between any fill bar segment and an active signal line is greater than or equal to 0.5 times the design rule metal pitch, the space (Z) between any fill bar segment and an active signal line is greater than or equal to 0.5*2.4 µm, which is 1.2 µm. In CMN5 P0 technology of VLSI Technology Inc., the design rule metal pitch is 2.1 micrometers. Thus, when the width (X) of each fill bar segment is less than or equal to 1.25 times the design rule metal pitch, the width (X) of each fill bar segment is less than or equal 1.25*2.1 µm, which is 2.625 µm. When the space (Y) between each fill bar segment is greater than or equal to 0.7 times the design rule metal pitch, the space (Y) between each fill bar segment is greater than or equal to 0.7*2.1 µm, which is 1.47 µm. When the space (Z) between any fill bar segment and an active signal line is greater than or equal to 0.5 times the design rule metal pitch, the space (Z) between any fill bar segment and an active signal line is greater than or equal to 0.5*2.1 µm, which is 1.05 µm.

Figure 2:
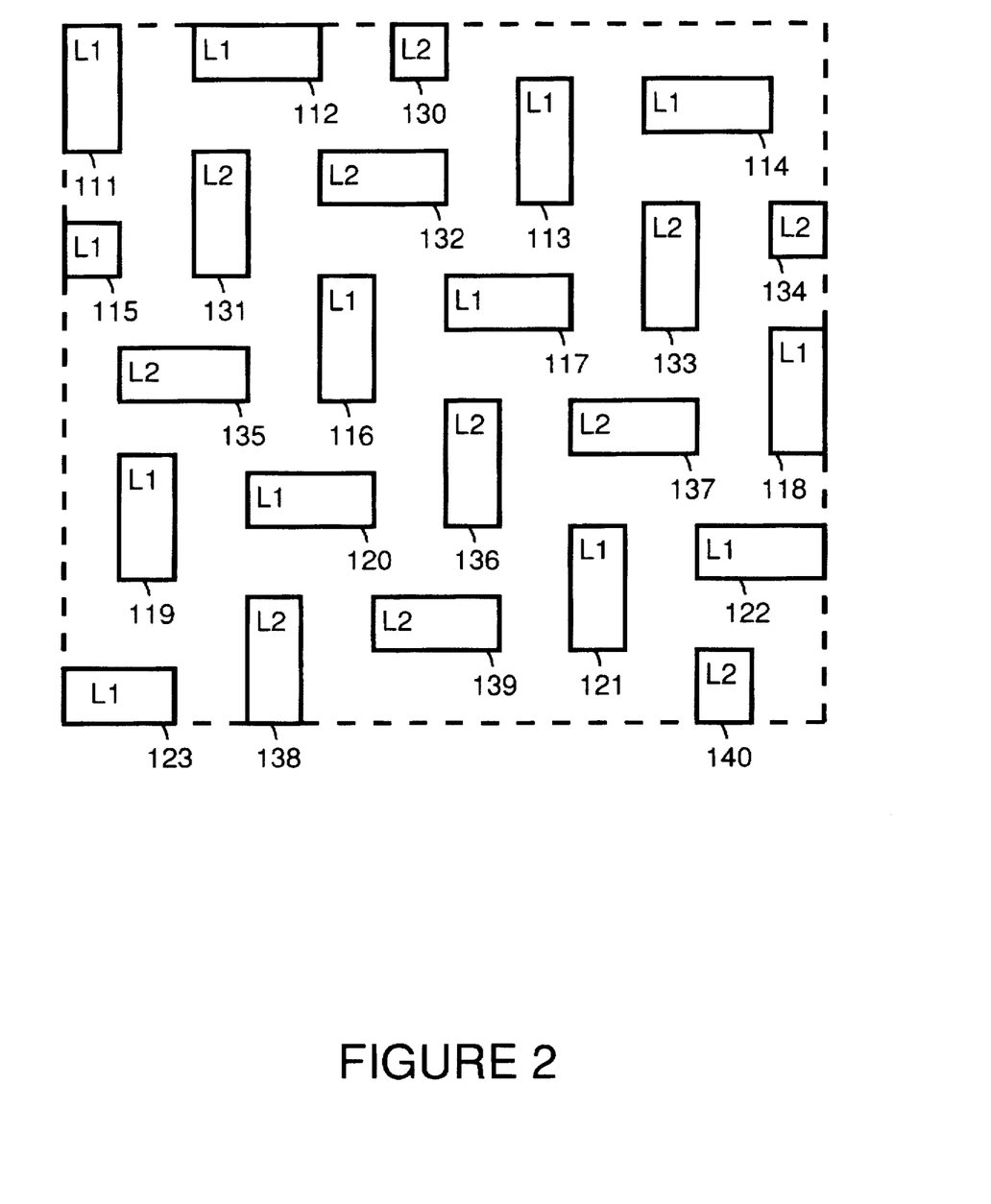
FIG. 2 illustrates a pattern fill pattern in accordance with a preferred embodiment of the present invention.

FIG. 2 shows a herring bone pattern for metal fill used in two 10 distinct layers. Included within the first metal layer is a metal fill segment 111, metal fill segment 112, metal fill segment 113, metal fill segment 114, metal fill segment 115, metal fill segment 116, metal fill segment 117, metal fill segment 118, metal fill segment 119, metal fill segment 120, metal fill segment 121, metal fill segment 122 and metal fill segment 123. Included 15 within the second metal layer is a metal fill segment 131, metal fill segment 132, metal fill segment 133, metal fill segment 134, metal fill segment 135, metal fill segment 136, metal fill segment 137, metal fill segment 138, metal fill segment 139 and metal fill segment 140.

The metal fill is added to a metal layer of an integrated circuit by adding a fill pattern to the active circuitry lines of a mask. One process which can be used to accomplished this is set out in U.S. patent application Ser. No. 08/504,157, filed Jul. 19, 1995. This process is described below.

In one embodiment of the present invention, a fill pattern is added to the active circuitry lines of a mask in order to improve global planarization. For example, a dielectric layer between a polysilicon layer and a first metal layer is planarized to facilitate pattern and etch of the first metal layer placed over the polysilicon layer. Likewise, a dielectric layer between the first metal layer and a second metal layer is planarized to facilitate pattern and etch of the second metal layer placed over the first metal layer.

Planarization is achieved by placing a fill pattern on a mask for the layer that is to be planarized. In one embodiment of the present invention, the fill pattern has the following characteristics. The fill pattern is made up of lines (called fill lines) and spaces comparable to those found on the circuit. Therefore, the spaces between geometries on the same layer throughout the circuit are fairly consistent. Design rules for circuitry are not violated. The fill lines are discontinuous at intervals to minimize the possibility of shorts.

Figure 3:
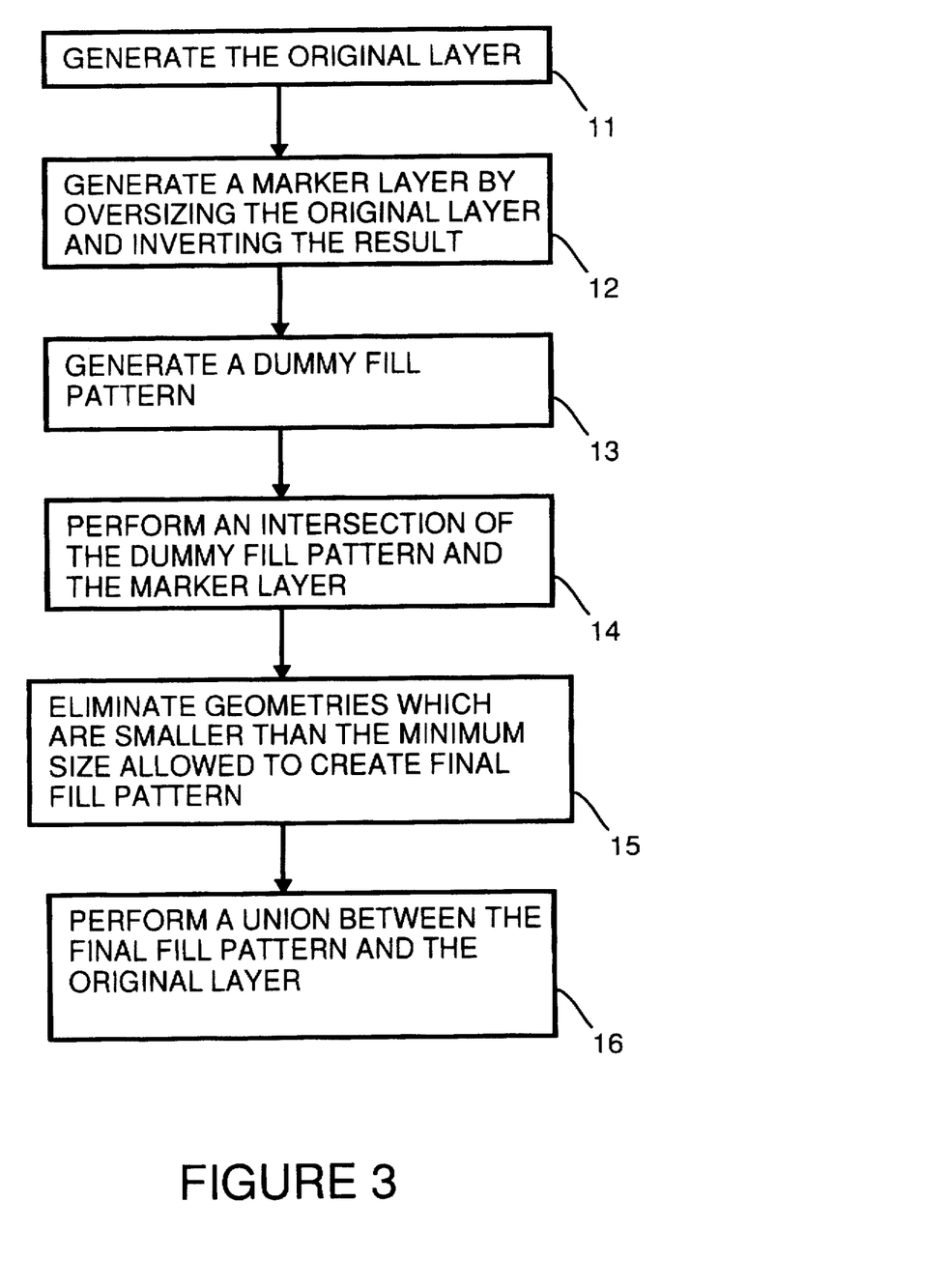
FIG. 3 is a flowchart which summarizes steps to generate pattern fill in accordance with a preferred embodiment of the present invention.

FIG. 3 is a flowchart which summarizes steps to generate a pattern filled mask in accordance with one embodiment of the present invention. In a step 11, an active layer consisting of active circuitry lines is generated for a mask in Manufacturing Electron Beam Exposure System (MEBES) format available from Etec Corporation of Hayward, Calif. This is done, for example, using generation software, such as Computer Aided Transcription System (CATS) available from Transcription Enterprises, Limited, having a business address of 105 Albright Way, Los Gatos, Calif. 95030. The active circuitry lines determine the pattern of a mask resulting from implementation of a circuit design before a fill pattern is added.

Figure 4:
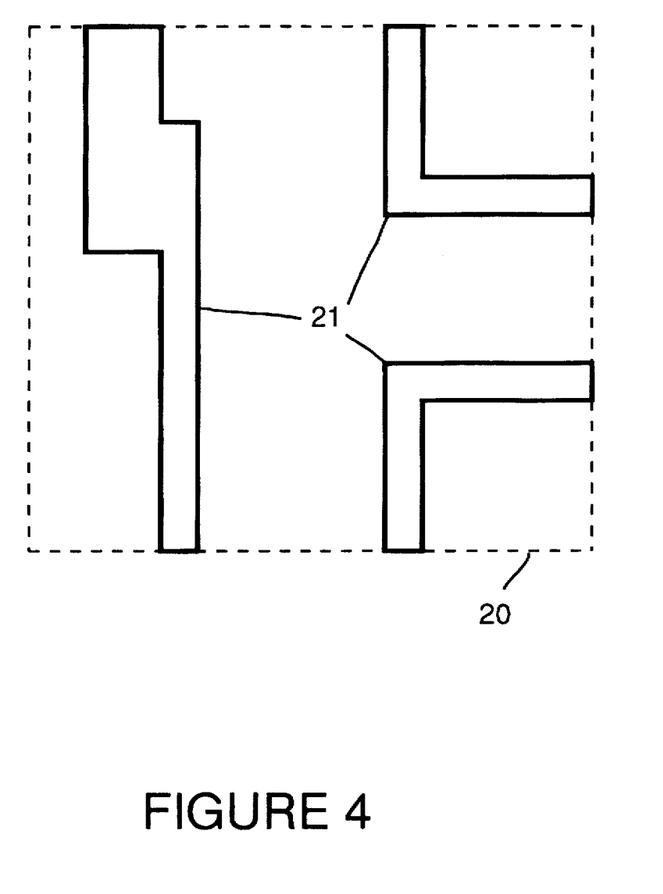
FIG. 4 shows active circuitry lines on a portion of a mask, the mask being used to pattern a processing layer in an integrated circuit manufacturing process in accordance with a preferred embodiment of the present invention.

For example, FIG. 4 shows a portion 20 of a pattern for a mask. The pattern includes active circuitry lines 21.

In a step 12, a marker layer is generated to mark areas on the mask to receive the fill pattern. The marker layer is generated by oversizing the active circuitry lines. For example, 0.75 microns is added in each direction to the width and to the height of each active circuitry line. After oversizing the active circuitry lines, the result is inverted to produce a negative of the pattern of the oversized active circuitry lines. The marker layer marks areas to be filled.

Figure 5:
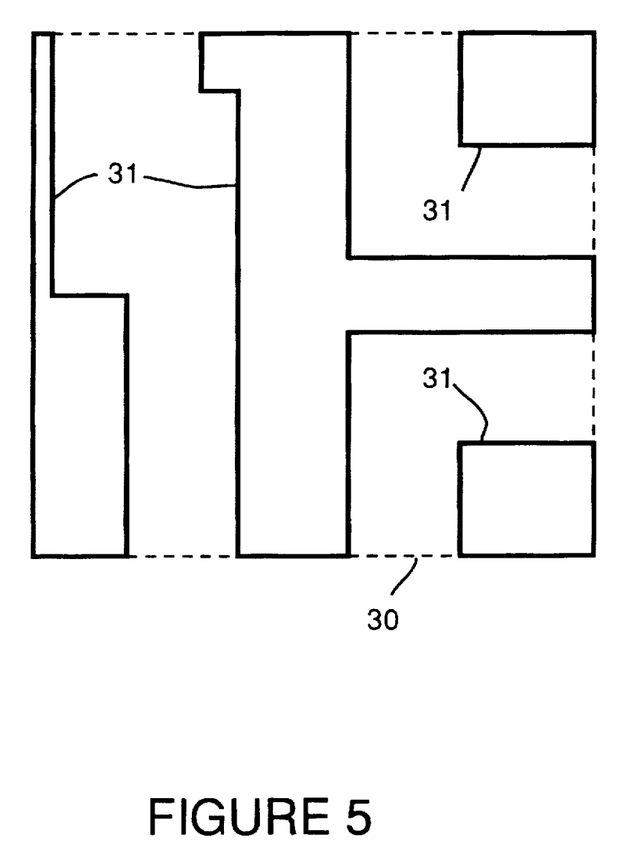
FIG. 5 shows a marker pattern generated by oversizing and then inverting the active circuitry lines shown in FIG. 4, in accordance with a preferred embodiment of the present invention.

For example, FIG. 5 shows a portion 30 of a marker layer for the mask. The pattern includes marked areas 31 corresponding to inversion of active circuitry of FIG. 4.

In a step 13, a dummy fill pattern is generated, for example using a layout editor or an automated pattern generator. For example, the dummy fill pattern is composed of rectangles (fill lines) of predetermined length and width. For example, the width of each rectangle is one micron and the height of each rectangle is ten microns. The rectangles are repeated at a predetermined spacing. For example, the spacing between the rectangles is 0.75 microns in both the horizontal and the vertical directions. Other pattern shapes also may be used. For example, in an alternate embodiment, a herring bone pattern is used.

Figure 6:
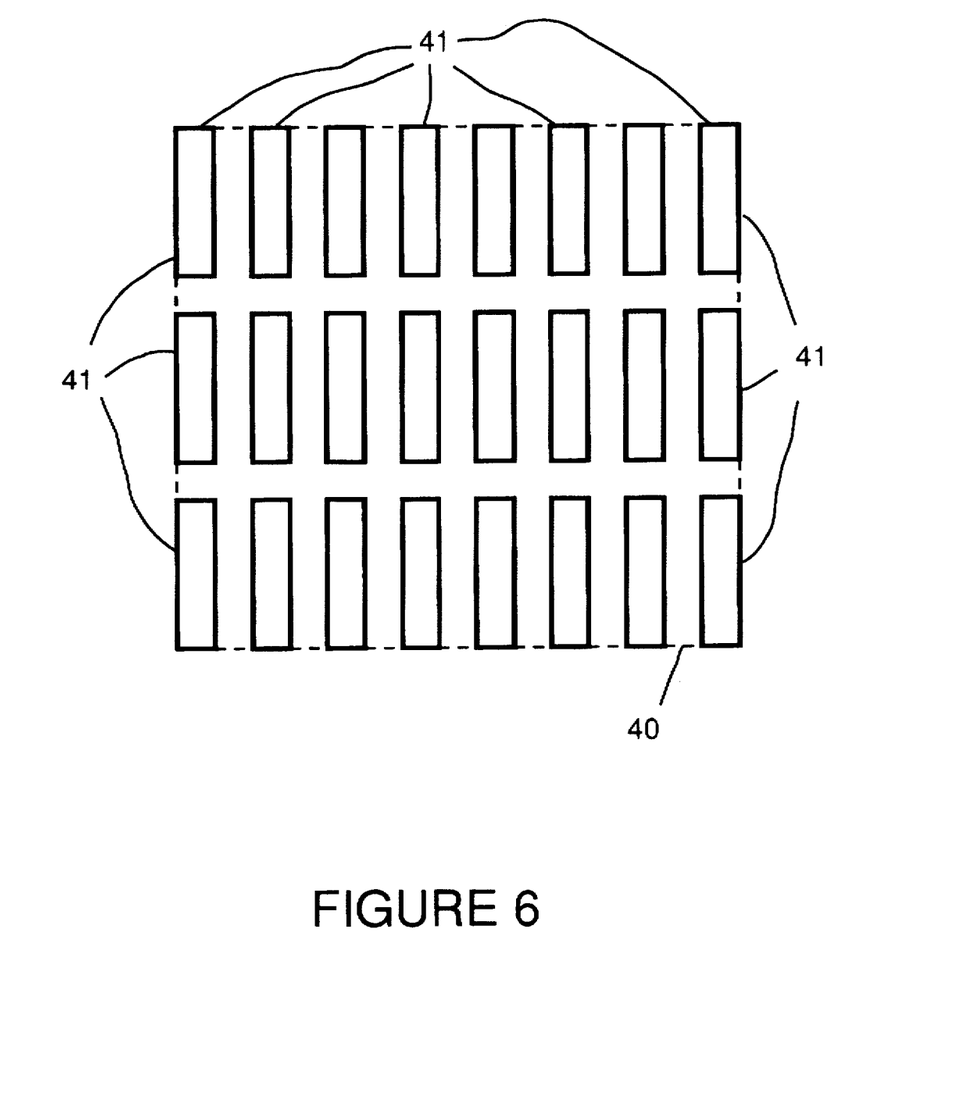
FIG. 6 shows a dummy fill pattern generated using a layout editor or an automated pattern generator, in accordance with a preferred embodiment of the present invention.

For example, FIG. 6 shows a portion 40 of a dummy fill pattern. The dummy fill pattern is composed of rectangles 41, as shown.

In a step 14, an intersection (logic AND) is performed of the marker layer generated in step 12 with the dummy fill pattern generated in step 13. The intersection is done without attempting to align the dummy fill pattern with the active circuitry lines. The resulting unsized fill pattern may contain geometries which are smaller than the minimum size allowed by design rules.

Figure 7:
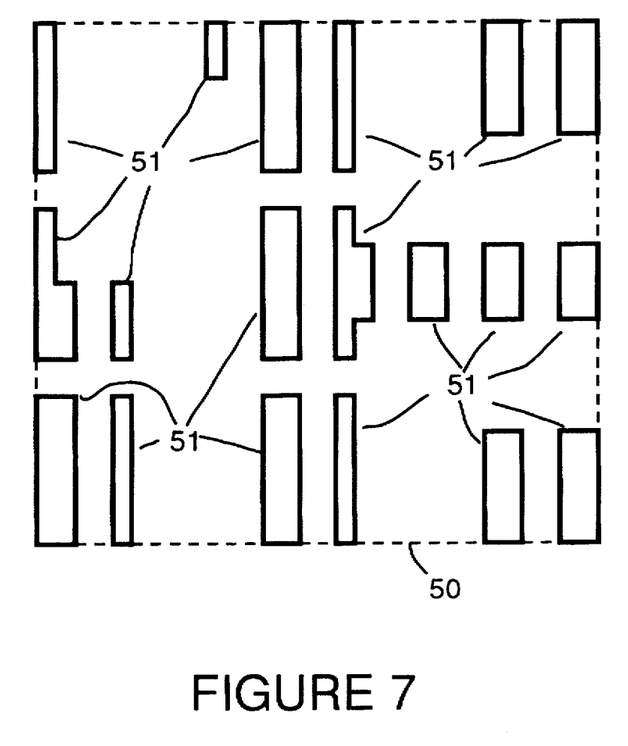
FIG. 7 shows an unsized fill pattern resulting from an intersection of the marker pattern shown in FIG. 4 with the dummy fill pattern shown in FIG. 6, in accordance with a preferred embodiment of the present invention.

For example, FIG. 7 shows a portion 50 of the unsized fill pattern described above. The unsized fill pattern includes rectangles and rectangle portions 51 remaining after intersection. Step 14, for example, is also used to clip the size of the fill pattern when the dummy fill pattern covers an area larger than the area covered by the mask.

In a step 15, the unsized fill pattern created in step 14, is negatively sized to eliminate geometries which are smaller than the minimum size allowed by design rules. The result is then resized an equal amount to restore the remaining geometries to their unsized dimensions. For example, areas that have widths or heights smaller than 1.00 microns are removed. The resulting pattern is the pattern fill to be used on the mask.

Figure 8:
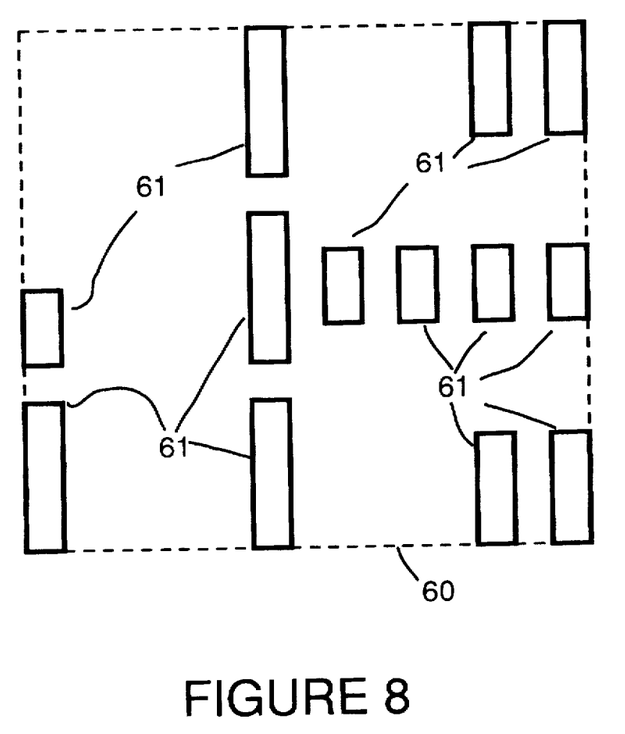
FIG. 8 shows a final fill pattern resulting from eliminating undersized geometries from the unsized fill pattern shown in FIG. 7, in accordance with a preferred embodiment of the present invention.

For example, FIG. 8 shows a portion 60 of the pattern fill resulting from the performance of step 15. The pattern fill shapes 61 will be used to provide fill for the mask.

In a step 16, a union (logic OR) of the active circuitry lines of the active layer generated in step 11 and the pattern fill shapes of the pattern fill generated in step 15 is performed. The results of this union is the completed mask layer definition and defines the pattern on the mask used for patterning the layer of material used in integrated circuit manufacturing.

Figure 9:
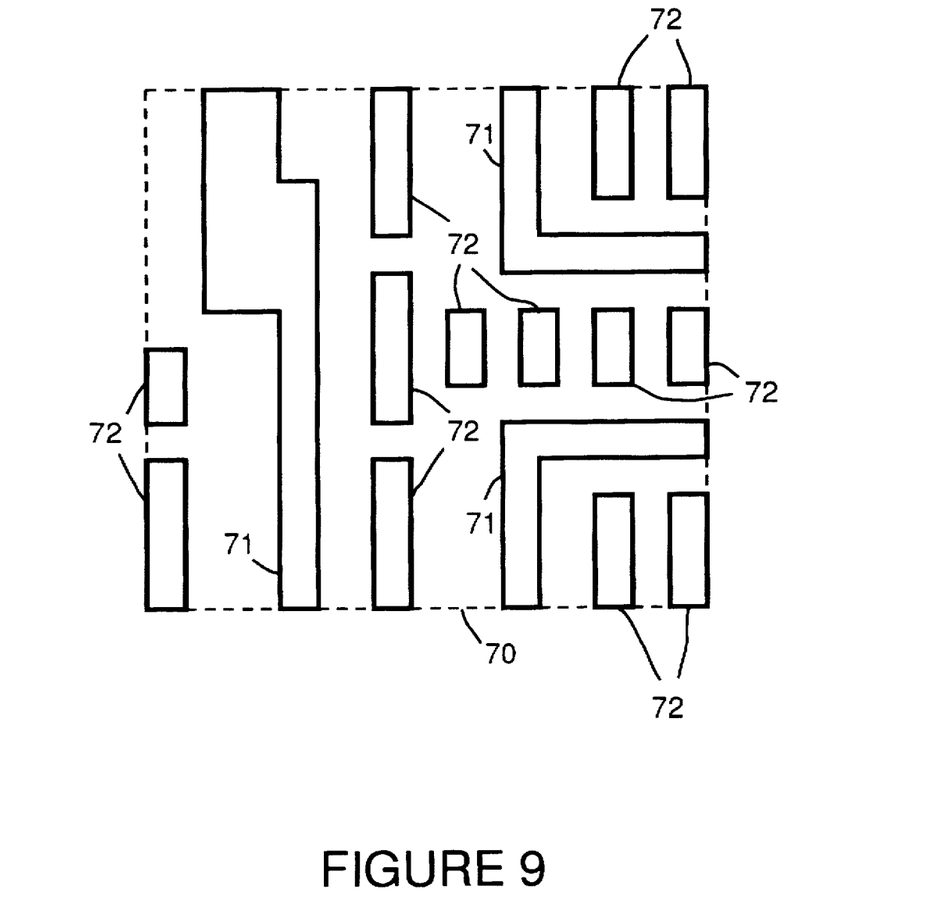
FIG. 9 shows a final pattern which is a union of the final fill pattern shown in FIG. 8 and the active circuitry lines shown in FIG. 4, in accordance with a preferred embodiment of the present invention.

For example, FIG. 9 shows a portion 70 of the pattern of the completed mask layer definition. The pattern of the completed mask layer definition includes active circuitry lines 71 and a fill pattern 72.

In the example set forth in the discussion pertaining to FIGS. 4 through 9, the dimensions are adjusted to conform to the constraints set forth in the discussion of FIG. 1. The dimensions set out in the discussion pertaining to FIGS. 4 through 9 is thus simply illustrative of an example of a pattern generation procedure.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An integrated circuit comprising:
a metal layer, the metal layer including
active signal lines, and
fill metal segments, the fill metal segments being polygons;
wherein
each fill metal segment at a narrowest section has a width which is not greater than 1.25 times a design rule metal pitch for a technology used to fabricate the integrated circuit, and
each fill metal segment is separated from every other fill metal segment by spacing which is at least 0.7 times the design rule metal pitch for the technology used to fabricate the integrated circuit.

2. An integrated circuit as in claim 1 wherein each fill metal segment is separated from every active signal line by spacing which is at least 0.5 times the design rule metal pitch for the technology used to fabricate the integrated circuit.

3. An integrated circuit as in claim 1 wherein the fill metal segments are arranged in a herring bone formation.

4. An integrated circuit as in claim 1 wherein the fill metal segments are rectangular in shape.

5. An integrated circuit comprising:
a metal layer, the metal layer including
active signal lines, and
fill metal segments, the fill metal segments being polygons;
wherein
each fill metal segment at a narrowest section has a width which is not greater than 1.25 times a design rule metal pitch for a technology used to fabricate the integrated circuit, and each fill metal segment is separated from every active signal line by spacing which is at least 0.5 times the design rule metal pitch for the technology used to fabricate the integrated circuit.

6. An integrated circuit as in claim 5 wherein the fill metal segments are rectangular in shape.

7. A method for increasing planarity of a processing layer of an integrated circuit, the method comprising the following step:

(a) generating a mask for the processing layer, including the following substeps, (a.1) generating active signal lines for the mask, (a.2) generating a fill pattern for the mask, the fill pattern being placed in areas of the mask not filled by the active signal lines, wherein the fill pattern is comprised of polygon shaped fill metal segments each fill metal segment having a width at a narrowest section which is not greater than 1.25 times a design rule metal pitch for a technology used to fabricate the integrated circuit, and each fill metal segment is separated from every active signal line by spacing which is at least 0.5 times the design rule metal pitch for the technology used to fabricate the integrated circuit, and (a.3) combining the active signal lines generated in substep (a.1) with the fill pattern generated in substep (a.2) to produce a final pattern for the mask.

8. A method as in claim 7 wherein substep (a.2) includes the following substeps:

(a.2.1) over-sizing the active signal lines to form a first pattern;

(a.2.2) inverting the first pattern to produce a negative of the first pattern, the negative of the first pattern serving as a marker layer;

(a.2.3) generating a dummy fill pattern;

(a.2.4) performing an intersection of the marker layer and the dummy fill pattern to produce an unsized fill pattern; and, (a.2.5) eliminating from the unsized fill pattern, areas which have widths smaller than a predetermined minimum width and areas which have heights smaller than a predetermined minimum height.

9. A method as in claim 7 wherein in substep (a.2), each fill metal segment is separated from every other fill metal segment by spacing which is at least 0.7 times the design rule metal pitch for the technology used to fabricate the integrated circuit.

10. A method as in claim 7 wherein in substep (a.2) the fill metal segments are rectangular in shape.

11. A method for increasing planarity of a processing layer of an integrated circuit, the method comprising the following step:

(a) generating a mask for the processing layer, including the following substeps, (a.1) generating active signal lines for the mask, (a.2) generating a fill pattern for the mask, the fill pattern being placed in areas of the mask not filled by the active signal lines, wherein the fill pattern is comprised of polygon shaped fill metal segments each fill metal segment at a narrowest section having a width which is not greater than 1.25 times a design rule metal pitch for a technology used to fabricate the integrated circuit, and each fill metal segment is separated from every other fill metal segment by spacing which is at least 0.7 times the design rule metal pitch for the technology used to fabricate the integrated circuit, and (a.3) combining the active signal lines generated in substep (a.1) with the fill pattern generated in substep (a.2) to produce a final pattern for the mask.

12. A method as in claim 11 wherein in substep (a.2) the fill metal segments are rectangular in shape.

* * * * *